(12) United States Patent
Jung et al.

(10) Patent No.: US 12,140,868 B2
(45) Date of Patent: Nov. 12, 2024

(54) SUBSTRATE TREATING APPARATUS WITH EXHAUST AIRFLOW GUIDE

(71) Applicant: SEMES CO., LTD., Cheonan-si (KR)

(72) Inventors: Sun Wook Jung, Hwaseong-si (KR); Ki Sang Eum, Cheonan-si (KR); Jin Ho Choi, Incheon (KR); Byoung Doo Choi, Cheonan-si (KR); Hee Man Ahn, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 27 days.

(21) Appl. No.: 17/749,437

(22) Filed: May 20, 2022

(65) Prior Publication Data

US 2023/0408925 A1 Dec. 21, 2023

(51) Int. Cl.
*G03F 7/16* (2006.01)
*B05C 11/10* (2006.01)

(52) U.S. Cl.
CPC .......... *G03F 7/162* (2013.01); *B05C 11/1039* (2013.01)

(58) Field of Classification Search
CPC ......... H01L 21/67017; H01L 21/67023; H01L 21/67028; H01L 21/67034; H01L 21/6704; H01L 21/67051; H01L 21/68764; H01L 21/02337; H01L 21/67178; H01L 21/68785; H01L 21/6715; H01L 21/30604; H01L 21/67393; H01L 21/6719; C23C 16/4412; C23C 16/45502; B05C 11/08; B05C 11/10; B05C 11/1039; B05C 21/00;
(Continued)

(56) References Cited

U.S. PATENT DOCUMENTS 5,965,200 A * 10/1999 Tateyama ............ B05C 11/1039
427/353
6,444,033 B1 * 9/2002 O'Mara .................. B05B 5/043
118/640
(Continued)

FOREIGN PATENT DOCUMENTS

JP H0945750 A 2/1997
JP 2001351857 A 12/2001
(Continued)

OTHER PUBLICATIONS

English translation, description only, JP2001351857, Kawaguchi et al, published Dec. 21, 2001 (Year: 2001).*
(Continued)

*Primary Examiner* — Karl Kurple
(74) *Attorney, Agent, or Firm* — Procopio, Cory, Hargreaves & Savitch LLP

(57) ABSTRACT

The inventive concept provides a substrate treating apparatus. The substrate treating apparatus includes substrate treating apparatus comprising: a treating container having an inner space; a support unit configured to support and rotate a substrate within the inner space; an exhaust duct configured to exhaust the inner space; and at least one guide member combined with the treating container and configured to guide an airflow within the inner space, and wherein the at least one guide member is arranged such that the airflow within the inner space obliquely flows with respect to a rotation direction of the substrate supported by the support unit when seen from above.

20 Claims, 14 Drawing Sheets

(58) Field of Classification Search
CPC ........... B05C 5/02; B05D 1/005; G03F 7/162; G03F 7/30; G03F 7/3021
USPC ........................................................ 118/52
See application file for complete search history.

(56) References Cited

U.S. PATENT DOCUMENTS

| | | | | |
|---|---|---|---|---|
| 7,276,118 | B2 * | 10/2007 | Lim | H01L 21/68721 |
| | | | | 118/612 |
| 8,714,601 | B2 * | 5/2014 | Kawamata | F16L 23/024 |
| | | | | 285/382.4 |
| 2006/0037537 | A1 * | 2/2006 | Lombardi | H01J 37/32495 |
| | | | | 118/504 |
| 2014/0326181 | A1 * | 11/2014 | Kim | C23C 14/246 |
| | | | | 118/715 |
| 2017/0151588 | A1 * | 6/2017 | Kim | G03F 7/162 |
| 2023/0384029 | A1 * | 11/2023 | Kang | H01L 21/68721 |

FOREIGN PATENT DOCUMENTS

| | | | |
|---|---|---|---|
| JP | 2002159904 A | 6/2002 | |
| JP | 2002164281 A | 6/2002 | |
| JP | 200439977 A | 2/2004 | |
| JP | 2004071964 A | 3/2004 | |
| KR | 10-2008-0071679 A | 10/2008 | |
| KR | 10-1689619 B1 | 12/2016 | |
| KR | 10-2020-0049997 A | 1/2021 | |
| KR | 1020200049997 | * 10/2021 | ........... H01L 21/687 |

OTHER PUBLICATIONS

English translation, description only, JP2002164281 et al, published Jun. 7, 2002 (Year: 2002).*

JP2004071964, Kakajima et al, published Mar. 4, 2004 (Year: 2004).*

* cited by examiner

SUBSTRATE TREATING APPARATUS WITH EXHAUST AIRFLOW GUIDE

TECHNICAL FIELD

Embodiments of the inventive concept described herein relate to a substrate treating apparatus, and more specifically to a substrate treating apparatus for supplying a liquid onto a rotating substrate.

BACKGROUND

In order to manufacture a semiconductor device, various processes such as a cleaning process, a deposition process, a photolithography process, an etching process, and an ion implantation process are performed. Among these processes, the photolithographic process includes a coating process of forming a film by applying a photosensitive liquid such as a photoresist on a surface of a substrate, an exposing process of exposing the photoresist film using a photomask defining a circuit pattern, and a developing process of selectively removing the exposed or unexposed region of the photoresist film formed on the substrate.

FIG. 1 is a view schematically illustrating a substrate treating apparatus 1 for applying the photoresist to the substrate. Referring to FIG. 1, the substrate treating apparatus 1 includes a treating container 10 having an inner space, a support unit 20 for supporting the substrate W in the inner space, and a nozzle 30 for supplying the treating liquid 82 onto the substrate W placed on the support unit 20. The treating container 10 has an outer cup 12 and an inner cup 14. In addition, a fan filter unit (not shown) for supplying a downward airflow to the inner space is disposed above the treating container 10, and a discharge pipe 60 for discharging the treating liquid and an exhaust pipe 70 for exhausting an atmosphere within the treating space are connected to the treating container 10.

When treating the substrate W while supplying the treating liquid 82 to the substrate W in a rotating state at the substrate treating apparatus 1 having a structure shown in FIG. 1, an airflow 84 flows along a rotation direction of the substrate W from a center to an edge of the substrate W at a surface of the substrate W due to a centrifugal force as shown in FIG. 2. Thereafter, as shown in FIG. 3, the aforementioned airflow 84 collides with an outer cup 12 and then flows downward to be discharged from an inner space to an outside through an exhaust pipe 70. At this time, as the airflow 84 changes from a horizontal direction to a vertical direction, the airflow 84 collides with the outer cup 12, and a vortex is generated at that point. The airflow 84 is stagnated at the point where the vortex is generated, and accordingly, an exhaust of within the inner space is not smoothly performed. Such a problem is further increased as a rotation speed of the substrate W increases.

As described above, a generation of vortex and a stagnation of the airflow at the collision point hinder a flow of the airflow at an edge region of the substrate W when a film of the treating liquid 82 is formed on the substrate W, and thus a thickness of a thin film in an edge region of the substrate W is formed thicker than a thickness of a thin film at a central region of the substrate W. In addition, contaminants such as a fume flow back onto the substrate W due to the vortex at the above collision point, causing a contamination on the substrate W.

SUMMARY

Embodiments of the inventive concept provide a substrate treating apparatus for improving substrate treating efficiency.

Embodiments of the inventive concept provide a substrate treating apparatus for effectively exhausting an air flow within a treating space, when a substrate is treated by supplying a treating liquid onto a rotating substrate at the treating space.

Embodiments of the inventive concept provide a substrate treating apparatus for uniformly providing a liquid film thickness at an entire region of a substrate when a liquid film is formed by supplying a treating liquid to the rotating substrate.

Embodiments of the inventive concept provide a substrate treating apparatus for preventing contaminants from being re-adsorbed to a substrate when treating the substrate by supplying a treating liquid to a rotating substrate.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a treating container having an inner space; a support unit configured to support and rotate a substrate within the inner space; an exhaust duct configured to exhaust the inner space; and at least one guide member combined with the treating container and configured to guide an airflow within the inner space, and wherein the at least one guide member is arranged such that the airflow within the inner space obliquely flows with respect to a rotation direction of the substrate supported by the support unit when seen from above.

In an embodiment, each of the at least one guide member comprises: a coupling portion configured to combine with the treating container; and an extension portion extending from the coupling portion, provided in a direction from a top to a bottom so its lengthwise direction has a predetermined angle with respect to a tangential direction of the substrate.

In an embodiment, one end of the coupling portion is combined to the treating container.

In an embodiment, the angle is 45 degrees.

In an embodiment, each of the at least guiding member further comprises a hinge pin configured to combine the extension portion to the treating container at a middle point of the extension portion, and wherein the extension portion further comprises: a fixing part disposed above the hinge pin and configured to be fixed to the treating container; and a rotation part disposed below the hinge pin and configured to rotate based on the hinge pin.

In an embodiment, the inner cup comprises a stopper configured to limit a rotation angle of the rotation part so the rotation part rotate within between a tangential direction of the substrate and a direction perpendicular to the sub state.

In an embodiment, the substrate treating apparatus further comprises: a fan unit configured to supply a downward airflow into the inner space; and a nozzle configured to supply a treating liquid to a substrate supported by the support unit.

In an embodiment, the at least one guide member comprises a plurality of guide members spaced apart along a circumferential direction of a substrate supported by the support unit.

The inventive concept provides a substrate treating apparatus. The substrate treating apparatus includes a treating container having an inner space; a support unit configured to support and rotate a substrate within the inner space; an exhaust duct configured to exhaust an airflow within the inner space; and a guide member combining with the treating container and configured to guide the airflow within the inner space, and wherein the guide member provided in a plurality are disposed adjacent so as to be inclined with respect to a tangential direction of the substrate supported by the support unit, and wherein the guide member is provided with its lengthwise direction in a direction from a top to a bottom, wherein the treating container comprises: an outer cup having an inner space with an open top; and an inner cup disposed within the inner space, having a cup shape with an opening formed at a top, and having a treating space formed within.

In an embodiment, the guide member is provided between the outer cup and the inner cup.

In an embodiment, the guide member comprises: a coupling portion configured to combine with the inner cup; and an extension portion extending from the coupling portion, provided in a direction from a top to a bottom so its lengthwise direction has a predetermined angle with respect to a tangential direction of the substrate.

In an embodiment, a bottom end of the extension portion is provided to be downwardly inclined in a direction facing the inner cup.

In an embodiment, at an outer surface of the extension portion adjacent to the outer cup, a groove portion is configured to form an inclined airflow based on the tangential direction of the substrate.

In an embodiment, the inner cup defines an exhaust space coupled to an exhaust pipe within the inner space, and an airflow within the inner space is exhausted from the treating container after being introduced into the exhaust space.

In an embodiment, the extension portion is disposed at a position higher than a top end of the exhaust duct provided at the exhaust space.

In an embodiment, the guiding member further comprises a hinge pin configured to couple the extension portion to the treating container at a central region of a lengthwise direction of the extension portion, and wherein the extension portion further comprises: a fixing part disposed above the hinge pin and configured to be fixed to the treating container; and a rotation part disposed below the hinge pin and configured to rotate based on the hinge pin.

In an embodiment, the inner cup further comprises a stopper configured to limit a rotation angle of the rotation part so the rotation part rotate within between a tangential direction of the substrate and a direction perpendicular to the substrate.

In an embodiment, the substrate treating apparatus comprises: a fan unit configured to supply a downward airflow into the inner space; and a nozzle configured to supply a treating liquid to a substrate supported by the support unit.

In an embodiment, the guide member provided in a plurality is spaced apart along a circumferential direction of a substrate supported by the support unit.

In an embodiment, the treating liquid is a photoresist liquid with a high viscosity.

According to an embodiment of the inventive concept, an airflow within an inner space when treating a substrate may be effectively exhausted by supplying a treating liquid onto a rotating substrate within the inner space of the treating container.

According to an embodiment of the inventive concept, a liquid film thickness at an entire region of a substrate may be uniformly formed when forming a liquid film by supplying a treating liquid to a rotating substrate.

According to an embodiment of the inventive concept, contaminants may be prevented from being re-adsorbed to a substrate when treating the substrate by supplying a treating liquid to a rotating substrate.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
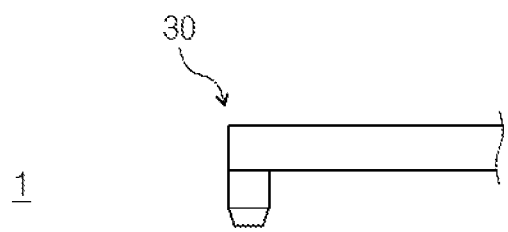
FIG. 1 is a cross-sectional view illustrating a substrate treating apparatus having a conventional structure performing a liquid treatment while rotating a substrate.
Figure 1:
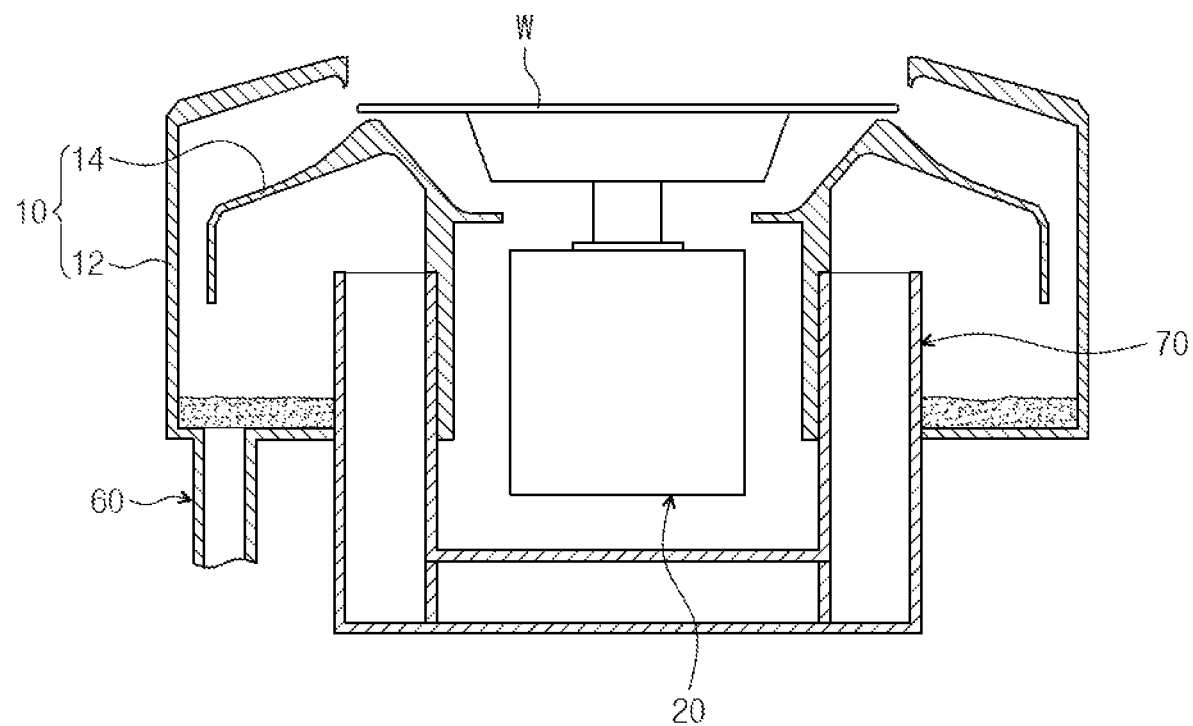
Figure 2:
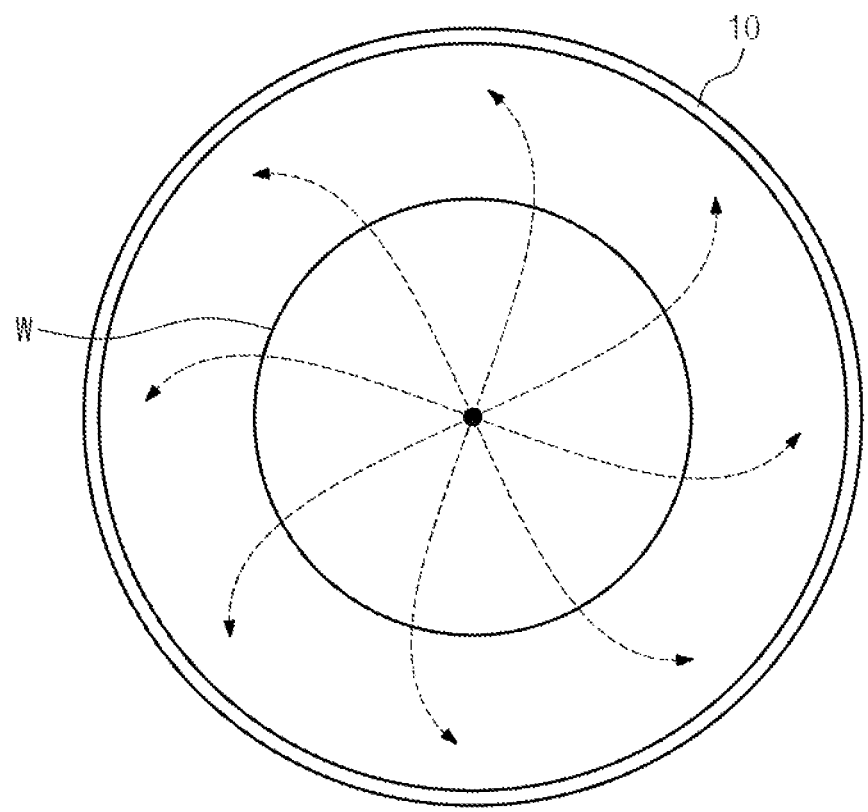
FIG. 2 is a plan view illustrating a direction of an airflow on a surface of the substrate at the substrate treating apparatus of FIG. 1.
Figure 3:
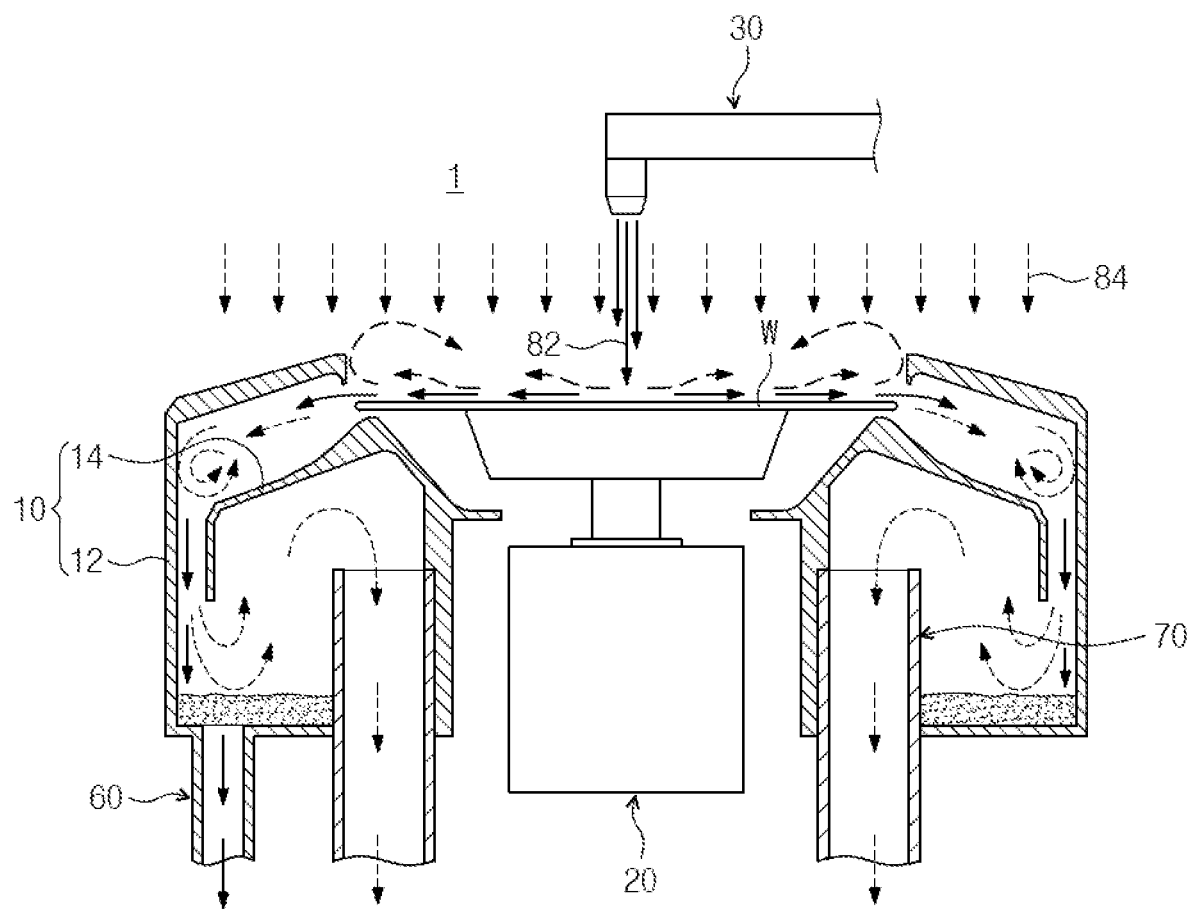
FIG. 3 is a cross-sectional view illustrating a flow of an airflow at the substrate treating apparatus of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms. The embodiment is provided to more fully explain the inventive concept to those with average knowledge in the art. Therefore, a form of the element in the drawing may be exaggerated and/or omitted to emphasize a clearer description.

An apparatus of the inventive concept may be used to perform a photolithography process on a circular substrate. In particular, the apparatus of the inventive concept may be connected to an exposing apparatus and used to perform a coating process and a developing process on a substrate. However, the technical idea of the inventive concept is not limited thereto, and may be used in various kinds of processes for supplying a treating liquid to the substrate while rotating the substrate. Hereinafter, a case in which a wafer is used as a substrate will be described as an example.

Figure 4:
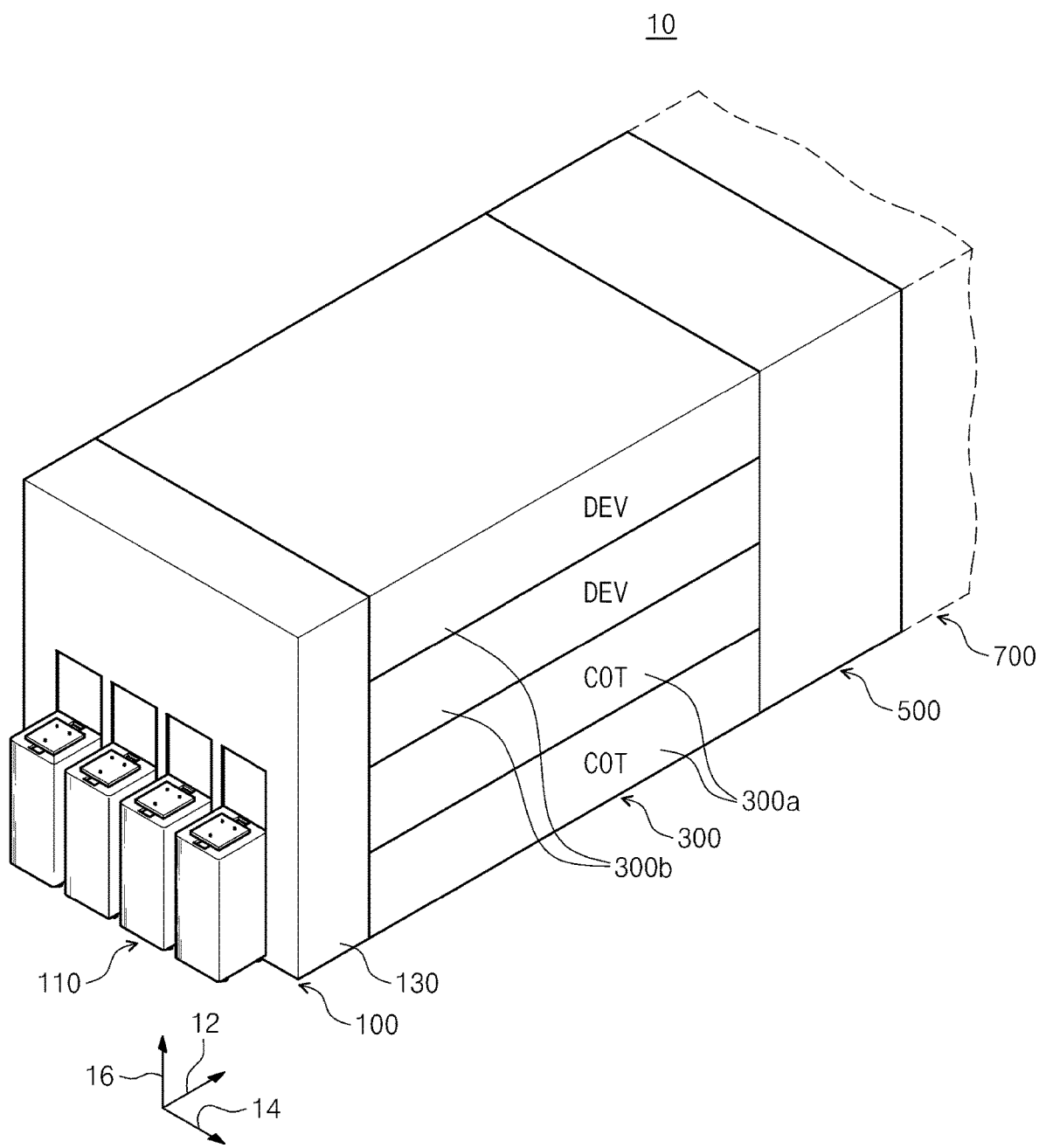
FIG. 4 is a perspective view schematically illustrating the substrate treating apparatus according to an embodiment of the inventive concept.
Figure 5:
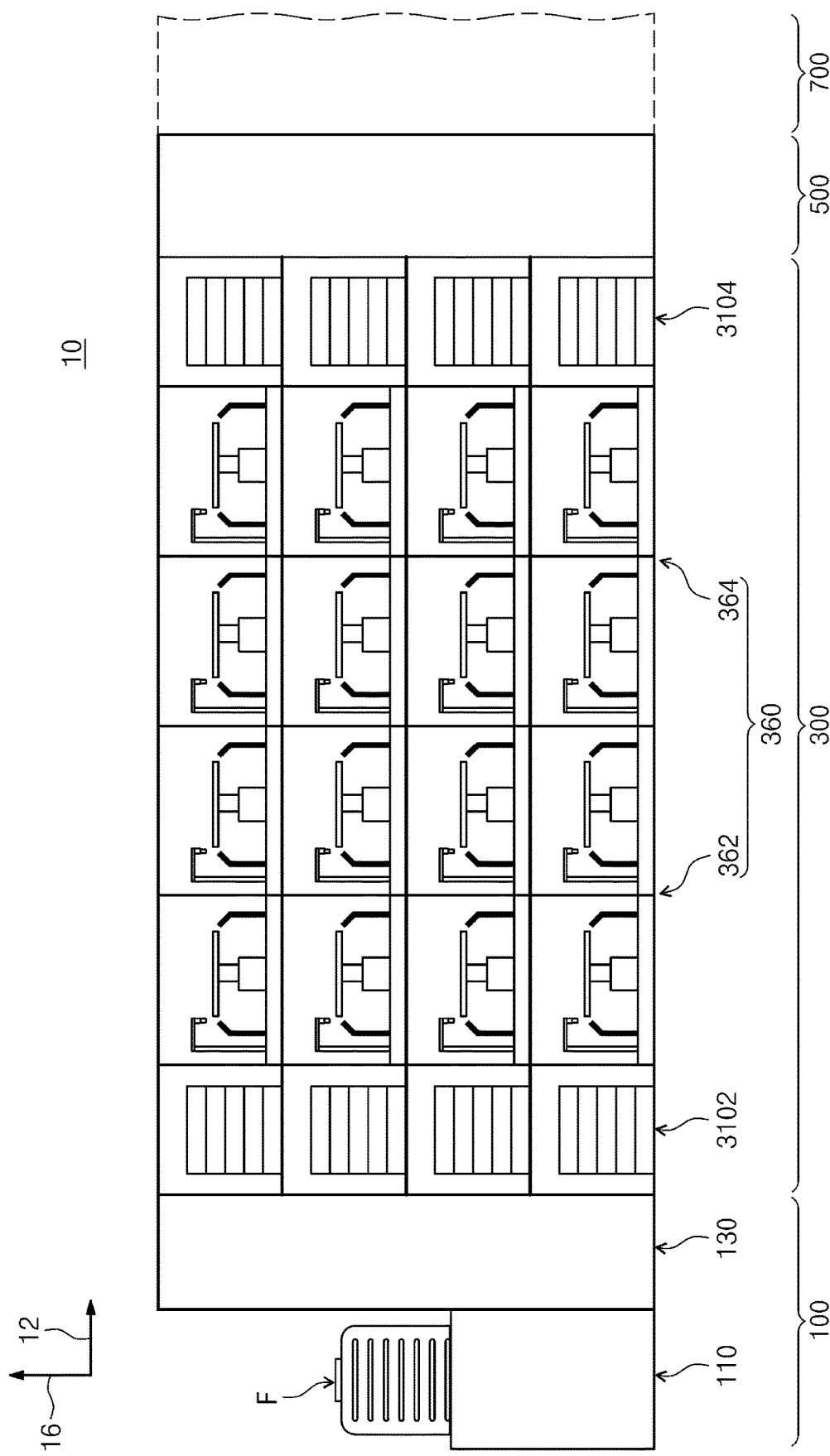
FIG. 5 is a cross-sectional view of the substrate treating apparatus showing a coating block or a developing block of FIG. 4.
Figure 6:
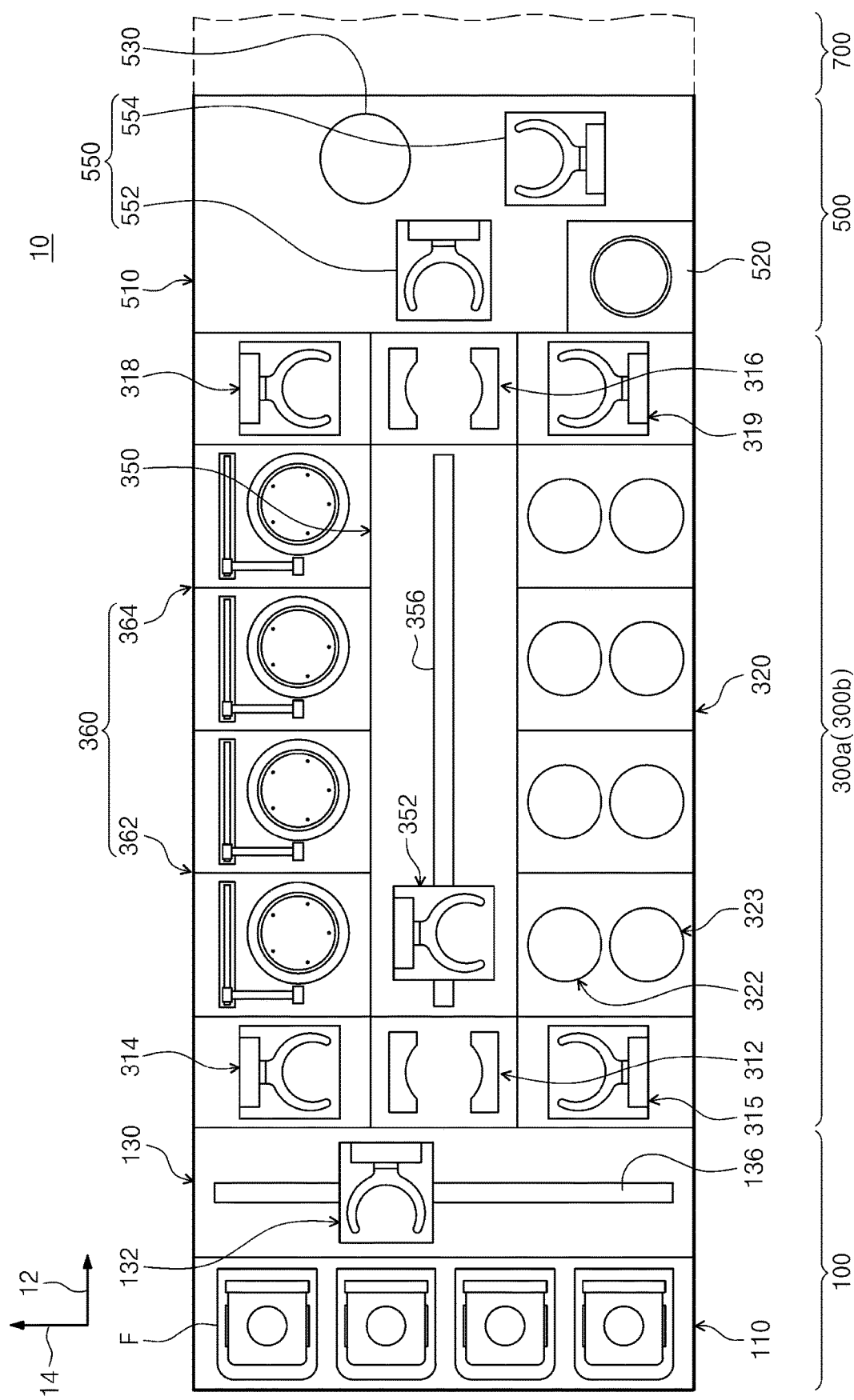
FIG. 6 is a plan view of the substrate treating apparatus of FIG. 1.

FIG. 4 is a perspective view schematically illustrating a substrate treating apparatus according to an embodiment of the inventive concept, FIG. 5 is a cross-sectional view of the substrate treating apparatus showing a coating block or a developing block of FIG. 4, and FIG. 6 is a plan view of the substrate treating apparatus of FIG. 4.

Referring to FIG. 4 to FIG. 6, the substrate treating apparatus 10 according to an embodiment of the inventive concept includes an index module 100, a treating module 300, and an interface module 500. According to an embodiment, the index module 100, the treating module 300, and the interface module 500 are sequentially arranged in a direction. Hereinafter, a direction in which the index module 100, the treating module 300, and the interface module 500 are arranged is defined as a first direction 12, a direction perpendicular to the first direction 12 when seen from above is defined as a second direction 14, and a direction perpendicular to both the first direction 12 and the second direction 14 is defined as a third direction 16.

The index module 100 transfers the substrate W to the treating module 300 from the container F in which the substrate W is stored, and stores a treated substrate W at the container F. A lengthwise direction of the index module 100 is provided in the second direction 14. The index module 100 has a load port 110 and an index frame 130. The load port 110 and the treating module 300 are disposed on two opposite sides of the index frame 130 along the first direction 12. The container F in which the substrates W are stored is placed on the load port 110. The load port 110 may be provided in a plurality, and the plurality of load ports 110 may be disposed in the second direction 14.

As the container F, a sealing container F such as a front open unified pod (FOUP) may be used. The container F may be placed on the load port 110 by a transfer means (not illustrated) such as an overhead transfer, an overhead conveyor, or an automatic guided vehicle, or by an operator.

An index robot 132 is provided within the index frame 130. A guide rail 136 provided with its lengthwise direction in the second direction 14 may be provided within the index frame 130, and the index robot 132 may be provided to be movable along the guide rail 136. The index robot 132 includes a hand on which the substrate W is placed, and the hand may be forwardly and backwardly movable, movable with the third direction 16 as an axis, and movable along the third direction 16.

The treating module 300 may perform a coating process and a developing process on the substrate W. The treating module 300 may receive a substrate W stored in the container F to perform a substrate treating process. The treating module 300 includes a coating block 300*a* and a developing block 300*b*. The coating block 300*a* performs a coating process on the substrate W, and the developing block 300*b* performs a developing process on the substrate W. The coating block 300*a* is provided in a plurality, and they are provided to be stacked on each other. The developing block 300*b* is provided in a plurality, and the developing blocks 300*b* are provided to be stacked on each other. According to an embodiment of FIG. 4, two coating blocks 300*a* are provided, and two developing blocks 300*b* are provided. The coating blocks 300*a* may be disposed under the developing blocks 300*b*. According to an embodiment, the two coating blocks 300*a* perform the same process and may have the same structure. In addition, the two developing blocks 300*b* perform the same process and may have the same structure.

Referring to FIG. 6, the coating block 300*a* includes a heat treating chamber 320, a transfer chamber 350, a liquid treating chamber 360, and buffer chambers 312 and 316. The heat treating chamber 320 performs a heat treatment process on the substrate W. The heat treatment process may include a cooling process and a heating process. The liquid treating chamber 360 supplies a liquid onto the substrate W to form a liquid film. The liquid film may be a photoresist film or an anti-reflection film. The transfer chamber 350 transfers the substrate W between the heat treating chamber 320 and the liquid treating chamber 360 within the coating block 300*a*.

The transfer chamber 350 is provided with its lengthwise direction parallel to the first direction 12. The transfer chamber 350 is provided with a transfer robot 352. The transfer robot 352 transfers the substrate between the heat treating chamber 320, the liquid treating chamber 360, and the buffer chambers 312 and 316. According to an embodiment, the transfer robot 352 has a hand on which the substrate W is placed, and the hand may be provided to be forwardly and backwardly movable, rotatable with the third direction 16 as an axis, and movable along the third direction 16. A guide rail 356 with its lengthwise direction parallel to the first direction 12 may be provided within the transfer chamber 350, and the transfer robot 352 may be provided to be movable along the guide rail 356.

Figure 7:
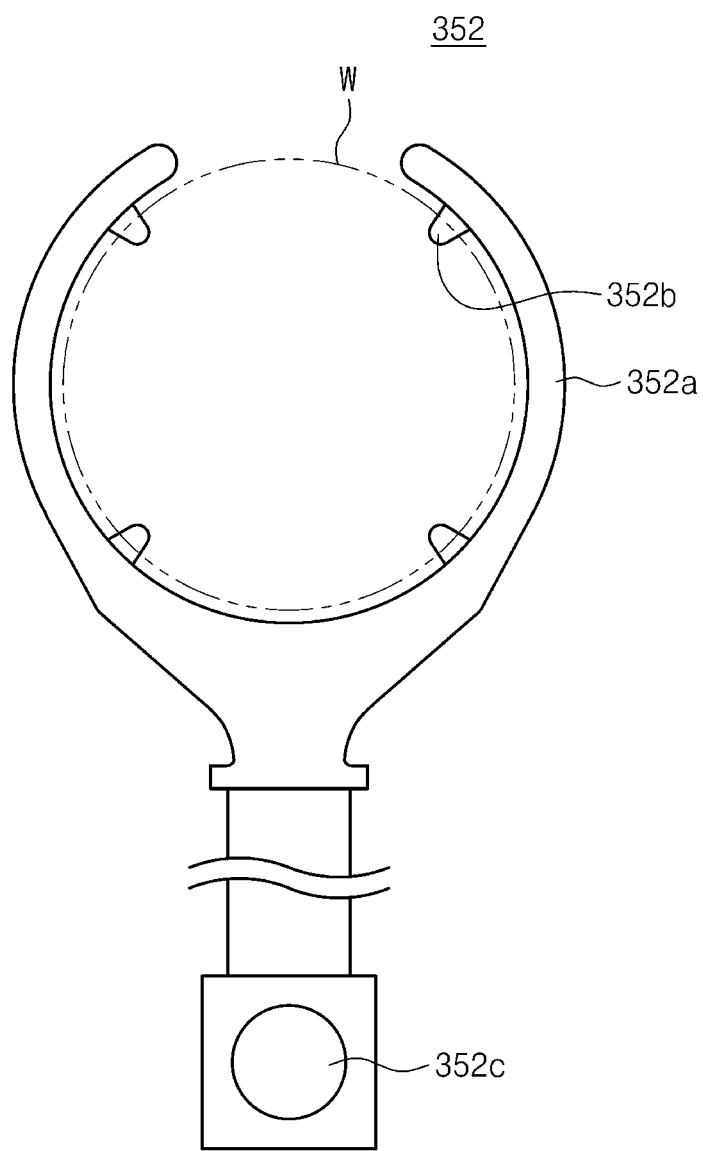
FIG. 7 is a plan view schematically illustrating a transfer robot of FIG. 6.

FIG. 7 illustrates an embodiment of a hand of a transfer robot. Referring to FIG. 7, the hand 352 has a base 352*a* and a support protrusion 352*b*. The base 352*a* may have an annular ring shape in which a portion of the circumference is cut-out. The base 352*a* has an inner diameter larger than a diameter of the substrate W. The support protrusion 352*b* extends from the base 352*a* to an inside thereof. The support protrusion 352*b* may be provided in a plurality and may support an edge region of the substrate W. According to an embodiment, four support protrusions 352*b* may be provided at equal intervals. In an embodiment, the hand 352 may be coupled to the transfer robot 352 via the central shaft 352*c* and moved.

The heat treating chamber 320 is provided in a plurality. The heat treating chambers 320 are arranged along the first direction 12. The heat treating chambers 320 are disposed on a side of the transfer chamber 350.

Figure 8:
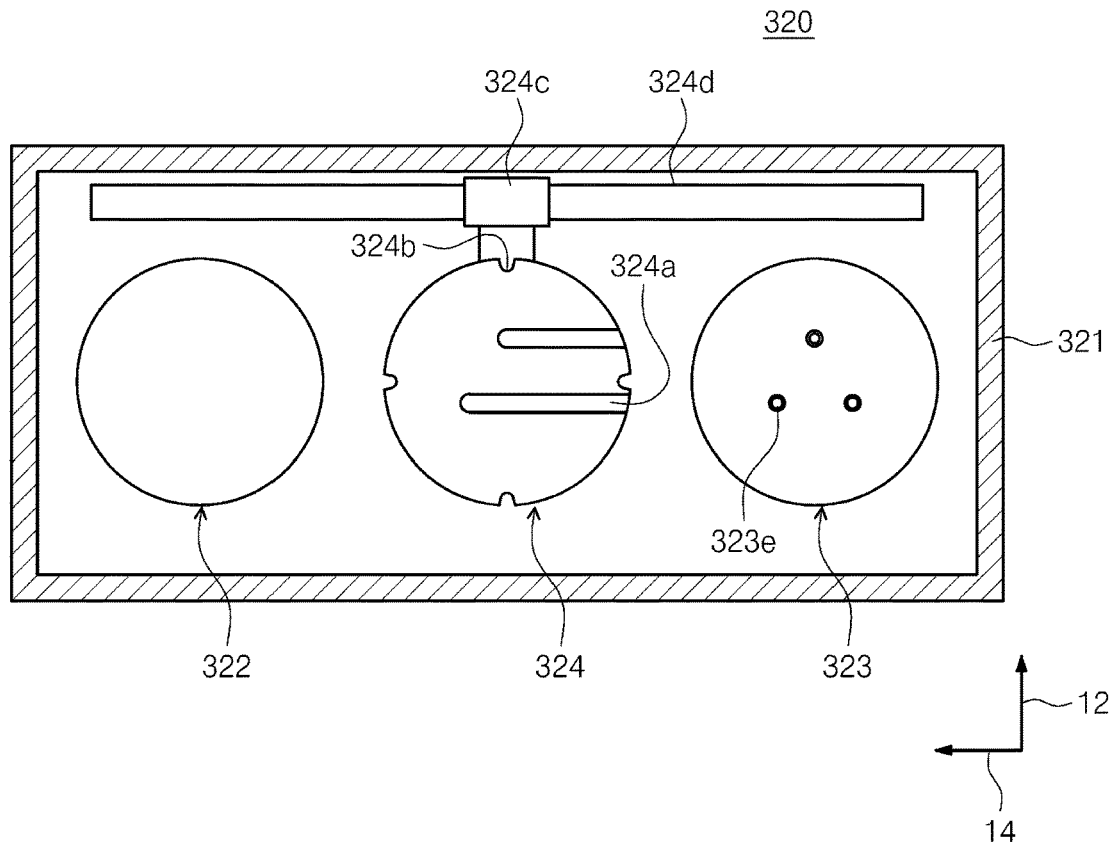
FIG. 8 is a plan view schematically illustrating an embodiment of a heat treating chamber of FIG. 6.
Figure 9:
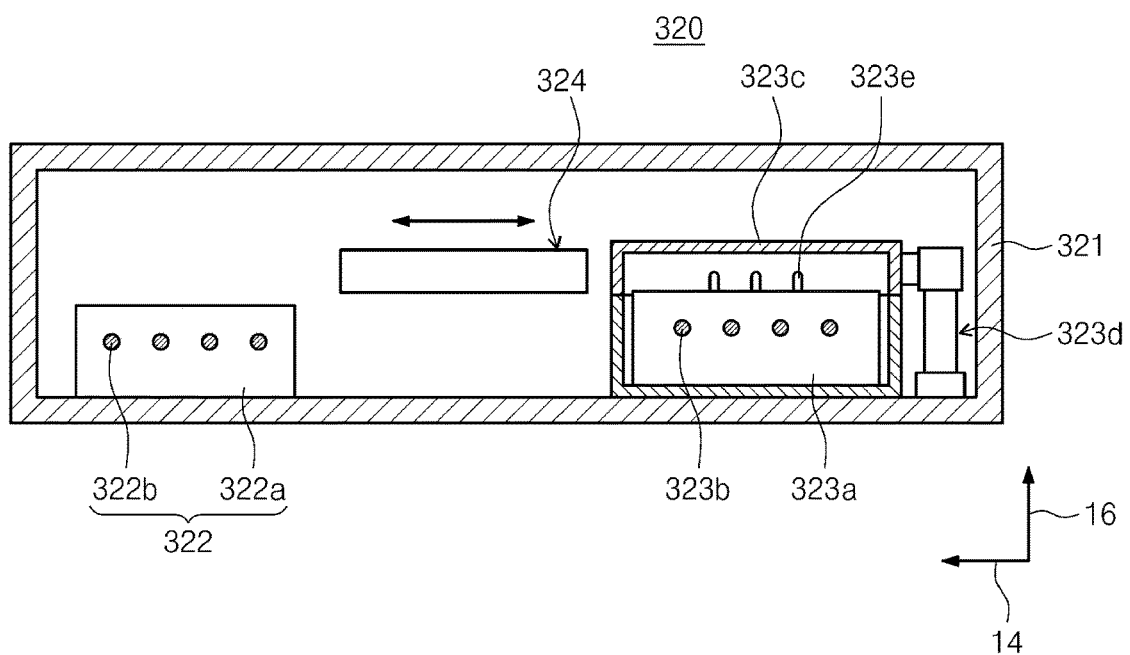
FIG. 9 is a front view of the heat treating chamber of FIG. 6.

FIG. 8 is a plan view schematically illustrating an embodiment of the heat treating chamber of FIG. 6, and FIG. 9 is a front view of the heat treating chamber of FIG. 8.

Referring to FIG. 8 and FIG. 9, the heat treating chamber 320 includes a housing 321, a cooling unit 322, a heating unit 323, and a transfer plate 324.

The housing 321 is provided in a substantially rectangular parallelepiped shape. An inlet (not shown) through which the substrate W enters and exits is formed on a sidewall of the housing 321. The inlet may be kept open. A door (not shown) may be provided to open and close the inlet. The cooling unit 322, the heating unit 323, and the transfer plate 324 are provided within the housing 321. The cooling unit 322 and the heating unit 323 are provided side by side along the second direction 14. According to an embodiment, the cooling unit 322 may be disposed closer to the transfer chamber 350 than the heating unit 323.

The cooling unit 322 has a cooling plate 322*a*. The cooling plate 322*a* may have a generally circular shape when viewed from above. A cooling member 322*b* is provided at the cooling plate 322*a*. According to an embodiment, the cooling member 322b may be formed in the cooling plate 322a and may be provided as a flow path through which a cooling fluid flows.

The heating unit 323 has a heating plate 323a, a cover 323c, and a heater 323b. The heating plate 323a has a generally circular shape when viewed from above. The heating plate 323a has a diameter larger than a diameter of the substrate W. A heater 323b is installed at the heating plate 323a. The heater 323b may be provided as a heating resistor to which a current is applied. The heating plate 323a is provided with lift pins 323e that may be driven in an up/down direction along the third direction 16. The lift pin 323e receives the substrate W from the transferring means outside the heating unit 323 and puts the substrate W onto the heating plate 323a or lifts the substrate W from the heating plate 323a to transfer it to the transferring means outside the heating unit 323. According to an embodiment, three lift pins 323e may be provided. The cover 323c has a space with an open bottom portion therein. The cover 323c is disposed above the heating plate 323a and is moved in the up/down direction by the driver 323d. A space formed by the cover 323c and the heating plate 323a by a moving of the cover 323c is provided as a heating space for heating the substrate W.

The transfer plate 324 has a substantially circular shape and has a diameter corresponding to that of the substrate W. A notch 324b is formed at an edge of the transfer plate 324. The notch 324b may have a shape corresponding to the protrusion 3543 formed on the hand 354 of the transfer robot 352. In addition, as many notches 324b as the protrusion 3543 formed on the hand 354 are formed in a position corresponding to the protrusions 3543. When the vertically aligned positions of the hand 354 and the transfer plate 324 are changed in the vertical direction, the substrate W is transferred between the hand 354 and the transfer plate 324. The transfer plate 324 may be mounted on the guide rail 324d and is movable along the guide rail 324d by the driver 324c. A plurality of guide grooves 324a in a slit shape are provided in the transfer plate 324. The guide grooves 324a inwardly extends from the edge of the transfer plate 324 into the inside of the transfer plate 324. The guide grooves 324a are provided with their length extending along the second direction 14, and the guide grooves 3242 are located to be spaced apart from each other along the second direction 14. The guide grooves 324a prevent the transfer plate 324 and the lift pin 323e from interfering with each other when the substrate W is handed over between the transfer plate 324 and the heating unit 323.

A cooling of the substrate W is performed in a state in which the transfer plate 324 on which the substrate W is placed is in contact with the cooling plate 322a. The transfer plate 324 is made of or includes a material having a high thermal conductivity so that heat transfer between the cooling plate 322a and the substrate W is well performed. According to an embodiment, the transfer plate 324 may be made of a metal material.

The heating unit 323 provided to some of the heat treating chambers 320 may improve an adhesion rate of the photoresist to the substrate W by supplying a gas during a heating of the substrate W. According to an embodiment, the gas may be a hexamethyldisilane (HMDS) gas.

The liquid treating chamber 360 may be provided in a plurality. Some of the liquid treating chambers 360 may be provided to be stacked on each other. The liquid treating chambers 360 are disposed on a side of the transfer chamber 350. The liquid treating chambers 360 are arranged side by side along the first direction 12. Some of the liquid treating chambers 360 are provided at a position adjacent to the index module 100. Hereinafter, these liquid treating chambers 360 are referred to as front liquid treating chambers 362. The other liquid treating chambers 360 are provided at a position adjacent to the interface module 500. Hereinafter, these liquid treating chambers 360 are referred to as a rear liquid treating chamber 364.

The front liquid treating chamber 362 coats a first liquid on the substrate W, and the rear liquid treating chamber 364 coats a second liquid on the substrate W. The first liquid and the second liquid may be different types of liquids. According to an embodiment, the first liquid is an anti-reflection film and the second liquid is a photoresist liquid. The photoresist liquid may be applied onto the substrate W coated with an anti-reflection film. Selectively, the first liquid may be a photoresist, and the second liquid may be an anti-reflection film. In this case, the anti-reflection film may be applied on the substrate W to which the photoresist liquid is applied. Selectively, the first liquid and the second liquid are the same type of liquid, all of which may be a photoresist liquid.

Hereinafter, a structure of the substrate treating apparatus for treating the substrate by supplying a treating liquid onto a rotating substrate among process chambers of the inventive concept will be described in detail. Hereinafter, a case in which the substrate treating apparatus is an apparatus for coating a photoresist liquid will be described as an example. However, the substrate treating apparatus may be an apparatus for forming a film such as a protective film or an anti-reflection film on the rotating substrate W. In addition, the substrate treating apparatus may optionally be apparatus for supplying a treating liquid 82 such as a developer to the substrate W.

Figure 10:
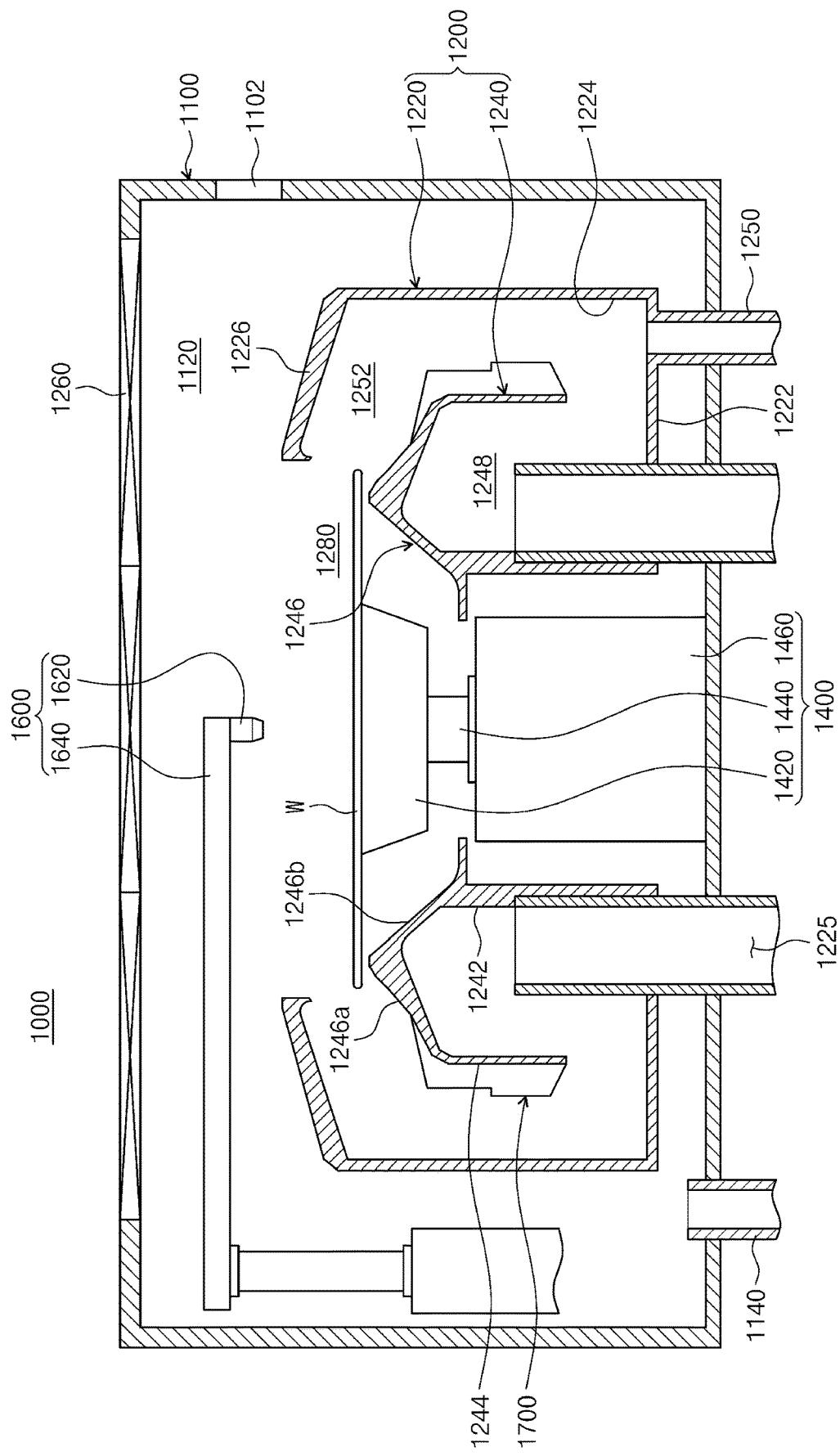
FIG. 10 is a cross-sectional view schematically illustrating a structure of the substrate treating apparatus for treating the substrate by supplying a liquid to a rotating substrate according to a first embodiment of the inventive concept.

FIG. 10 is a cross-sectional view illustrating an embodiment of the substrate treating apparatus for treating the substrate by supplying a treating liquid to a rotating substrate. Referring to FIG. 10, the substrate treating apparatus includes a housing 1100, a treating container 1200, a substrate support unit 1400, a liquid supply unit 1600, an exhaust unit, and a guide member 1700.

The housing 1100 may have a rectangular cylindrical shape having an inner space 1120. An opening 1102 is formed at a side of the housing 1100. The opening 1102 functions as a passage through which the substrate W is carried in and carried out. A door (not shown) is installed at the opening 1100, and the door opens and closes the opening. A treating container 1200 is provided at the inner space 1120 of the housing 1100. The treating container 1200 has an inner space 1280. The inner space 1280 is provided such that a top portion thereof is opened.

The support unit 1400 supports the substrate W in the inner space 1280 of the treating container 1200. The support unit 1400 includes a support plate 1420, a rotary shaft 1440, and a driver 1460. A top surface of the support plate 1420 has a circular shape. The support plate 1420 has a diameter smaller than a diameter of the substrate W. The support plate 1420 is provided to support the substrate W by a vacuum pressure. Selectively, the support plate 1420 may have a mechanical clamping structure supporting the substrate W. The rotary shaft 1440 is coupled to a center of a bottom surface of the support plate 1420, and the rotary shaft 1440 is provided with a driver 1460 that provides a rotational force to the rotary shaft 1440. The driver 1460 may be a motor.

The liquid supply unit 1600 supplies the treating liquid onto the substrate W. In an embodiment, the treating liquid may be a photosensitive liquid such as a photoresist liquid.

In an embodiment, the treating liquid may be a photoresist liquid having a high viscosity. The liquid supply unit 1600 has a nozzle 1620, a nozzle moving member 1640, and a liquid supply source (not shown). One nozzle or a plurality of nozzles 1620 are provided, and the treating liquid is discharged to the substrate W by the one or the plurality of the nozzles 1620. The nozzle 1620 is supported by the nozzle moving member 1640. The nozzle moving member 1640 moves the nozzle 1620 between a process position and a standby position. In the process position, the nozzle 1620 supplies the treating liquid onto the substrate W placed on the support plate 1420, and the nozzle 1620 that has completed a supplying of the treating liquid stands by in the standby position. At the standby position, the nozzle 1620 stands by at a home port (not shown), and the home port is disposed outside the treating container 1200 within the housing 1100.

A fan filter unit 1260 for supplying a downward airflow 84 to the inner space is disposed on a top wall of the housing 1100. The fan filter unit 1260 has a fan for introducing an external air into the inner space and a filter for filtering the external air. An exhaust pipe 1140 for exhausting an airflow supplied to a space between the treating container 1200 and the housing 1100 is connected to an outside of the treating container 1200 in the housing 1100.

The treating container 1200 has an outer cup 1220 and an inner cup 1240.

In an embodiment, the outer cup 1220 is provided to surround the support unit 1400 and the substrate W supported therein. The outer cup 1220 has a bottom wall 1222, a sidewall 1224, and a top wall 1226. An inside of the outer cup 1220 is provided as the above-described inner space 1280. The inner space 1280 includes part of the treating space 1252 at a top and the exhaust space 1248 at a bottom.

The bottom wall 1222 may have a circular shape and has an opening at a center. The sidewall 1224 upwardly extends from an outer end of the bottom wall 1222. The sidewall 1224 may have a ring shape and is provided perpendicular to the bottom wall 1222. In an embodiment, the sidewall 1224 may extend to a same height as the top surface of the support plate 1420 or may extend to a height slightly lower than the top surface of the support plate 1420. The top wall 1226 has a ring shape and has an opening at the center. The top wall 1226 is provided to be upwardly and inwardly inclining from a top end of the sidewall 1224 toward a central axis of the outer cup 1220.

The inner cup 1240 is located inside the outer cup 1220. The inner cup 1240 has an inner wall 1242, an outer wall 1244, and a top wall 1246. The inner wall 1242 has a through hole penetrating in an up/down direction. The inner wall 1242 is disposed to surround the driver 1460. The inner wall 1242 minimizes exposure of the driver 1460 to the airflow 84 in the treating space. The rotary shaft 1440 or/and the driver 1460 of the support unit 1400 extend in the up/down direction through the through hole. A lower end of the inner wall 1242 may be located on the bottom wall 1222 of the outer cup 1220. The outer wall 1244 is disposed to be spaced apart from the inner wall 1242 and to surround the inner wall 1242. The outer wall 1244 is disposed to be spaced apart from the sidewall 1224 of the outer cup 1220. The outer wall 1244 is disposed to be spaced apart from the protrusion 1228 of the outer cup 1220. The inner wall 1242 is disposed to be spaced apart upwardly from the bottom wall 1222 of the outer cup 1220. The top wall 1246 connects the top end of the outer wall 1244 to the top end of the inner wall 1242. The top wall 1246 has a ring shape and is disposed to surround the support plate 1420. According to an embodiment, the top wall 1246 has an upwardly convex shape. The top wall 1246 has an outer top wall 1246a upwardly inclined from the top end of the outer wall 1244 toward the rotary shaft 1440, and an inner top wall 1246b downwardly inclined from the top wall 1246 to the end of the inner wall 1242. The support plate 1420 may be located in a space surrounded by the inner top wall 1246b. According to an embodiment, a highest point of the top wall 1226 may be disposed outside the support plate 1420 and more inward than the end of the substrate W supported by the support unit 1400.

A space under the support plate 1420 within the treating space may be provided as an exhaust space 1248. According to an embodiment, the exhaust space 1248 may be defined by the inner cup 1240. A space surrounded by the outer wall 1244, the top wall 1246, and the inner wall 1242 of the inner cup 1240 and/or a space below it may be provided as an exhaust space 1248.

A discharge pipe 1250 for discharging the treating liquid is connected to the bottom wall 1222 of the outer cup 1220. The discharge pipe 1250 discharges the treating liquid introduced between a sidewall 1224 of the outer cup 1220 and an outer wall 1244 of the inner cup 1240 to the outside of the treating container 1200. An airflow flowing into a space between the sidewall 1224 of the outer cup 1220 and the outer wall 1244 of the inner cup 1240 is introduced into a space surrounded by the sidewall 1224 and the bottom wall 1222 of the outer cup 1220, and then introduced into the exhaust space 1248. In this process, the treating liquid contained within the airflow is discharged from the discharge space 1252 to the outside of the treating container 1200 through the discharge pipe 1250, and the airflow is introduced into the exhaust space 1248 of the treating container 1200. In an embodiment, one or a plurality of discharge pipes 1250 may be provided. When the plurality of discharge pipes 1250 are provided, the plurality of discharge pipes 1250 may be provided along a circumferential direction of the inner cup 1240.

Although not shown, a lifting/lowering driver for adjusting a relative height of the support plate 1420 and the outer cup 1220 may be provided. According to an embodiment, the lifting/lowering driver may lift and lower the outer cup 1220 in the up/down direction. For example, when the substrate W is loaded on the support plate 1420 or the substrate W is unloaded from the support plate 1420, the support plate 1420 is disposed higher than a top end of the outer cup 1220 to prevent the transfer member for transferring the substrate W from interfering with the outer cup 1220. Also, when the process is performed, the support plate 1420 is disposed at a lower height than the top end of the outer cup 1220 so that the substrate W is disposed within the treating space.

The exhaust unit has an exhaust duct 1225. The exhaust duct 1225 exhausts an airflow introduced into the exhaust space 1248 of the treating container 1200 to the outside of the treating container 1200. According to an embodiment, the exhaust duct 1225 is connected to the inner wall 1242 of the inner cup 1240. The exhaust duct 1225 may extend to a space between the outer wall 1244 and the inner wall 1242 of the inner cup 1240. Selectively, the exhaust duct 1225 may be coupled to the outer wall 1244 of the inner cup 1240 such that an inlet thereof is provided on the outer wall 1244. According to an embodiment, the exhaust duct 1225 may be coupled to the treating container 1200 so an introduction direction of the airflow is different from above. Selectively, the exhaust duct 1225 may be coupled to the treating container 1200 in a direction different from the tangential direction with respect to the rotation direction of the substrate W. Selectively, the exhaust duct 1225 may be coupled to the bottom wall 1222 of the outer cup 1220. A pressure adjusting member (not shown) is installed at the exhaust duct 1225 to forcibly suck an airflow in the exhaust space 1248. The pressure adjusting member may be a pump.

The guide member 1700 forms an airflow in the inner space 1252 and the exhaust space 1248.

In an embodiment, the guide member 1700 guides a flow of an airflow at a height equal to or adjacent to a top surface of the substrate W. When the substrate W is rotated, a downward airflow provided to a top region of the substrate W flows in a direction from a central region of the substrate W to an edge region of the substrate W by a centrifugal force. On a surface of the substrate W and an area adjacent thereto, the airflow is bent in a same direction as the rotation direction of the substrate W and flows toward an outside of the substrate W. When this airflow deviates from the top surface of the substrate W, the airflow direction is generally parallel to a tangential line of the substrate W. However, when the rotation speed of the substrate W is provided at a high speed, the airflow formed parallel to the tangential line of the substrate W is stagnated in a region adjacent to the substrate W. To prevent this, the guide member 1700 of the inventive concept is arranged to allow the airflow in the inner space 1252 to have a direction not parallel with (e.g., intersecting) the rotation direction of the substrate W when seen from above. For example, the angle between the airflow direction in the inner space 1252 and the substrate rotation direction may be about 30 to 60 degrees.

The guide member 1700 is provided to make an airflow out of the top surface of the substrate W not flow along the rotation direction of the substrate W, e.g., the airflow direction intersects the substrate rotation direction. According to an embodiment, the guide member 1700 is provided in a space between the outer cup 1220 and the inner cup 1240, the airflow in the space between the outer cup 1220 and the inner cup 1240 flows obliquely assuming the substrate rotation direction is horizontal.

Figure 11:
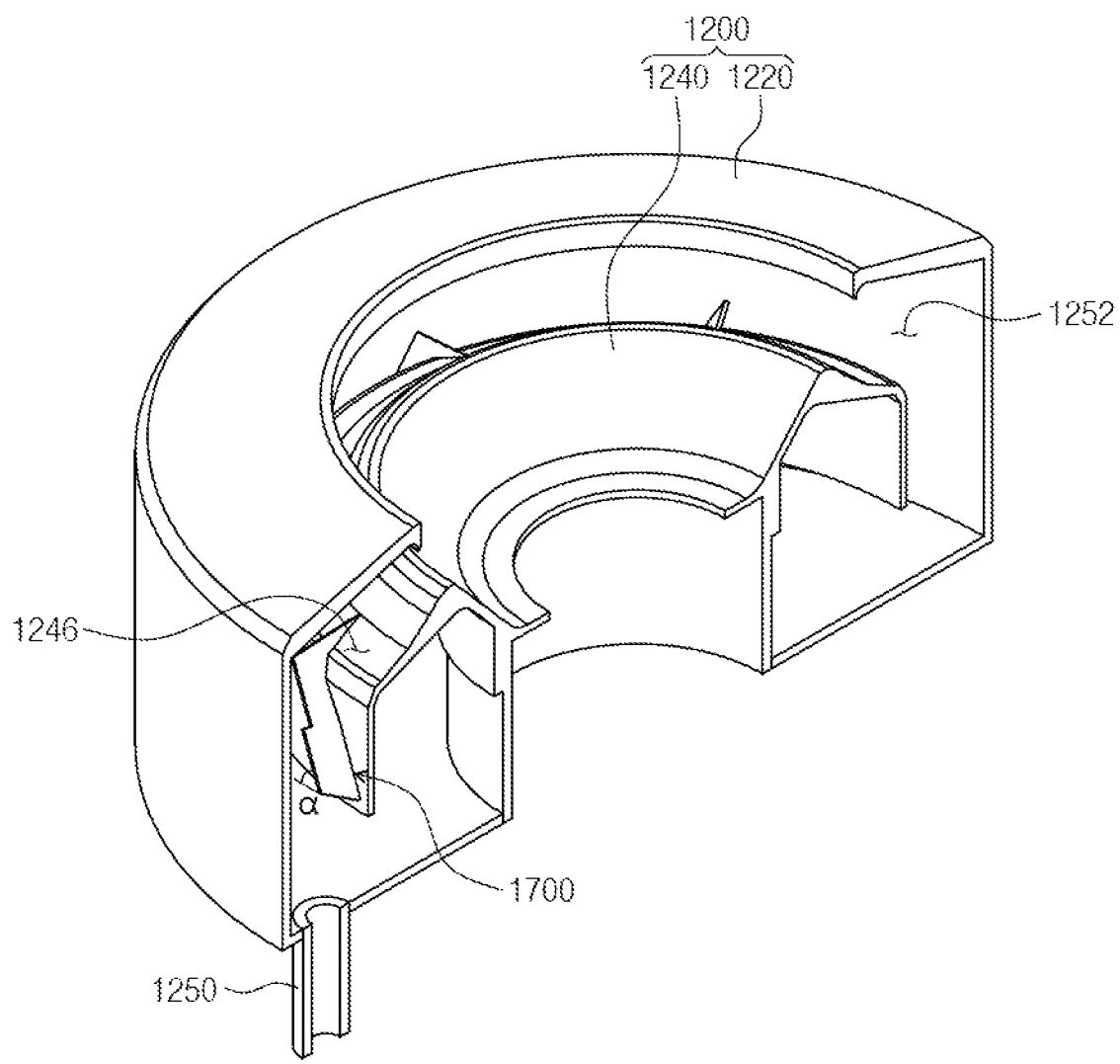
FIG. 11 is a cut perspective view of the substrate treating apparatus of FIG. 10.

Hereinafter, the guide member 1700 of the inventive concept will be described in detail with reference to FIG. 11 to FIG. 13. FIG. 11 is a cut perspective view of the substrate W treating apparatus of FIG. 10, FIG. 12 is a perspective view illustrating a state in which the guide member 1700 of FIG. 10 is coupled to the inner cup 1240, and FIG. 13 is a perspective view of the guide member 1700 of FIG. 10.

Figure 12:
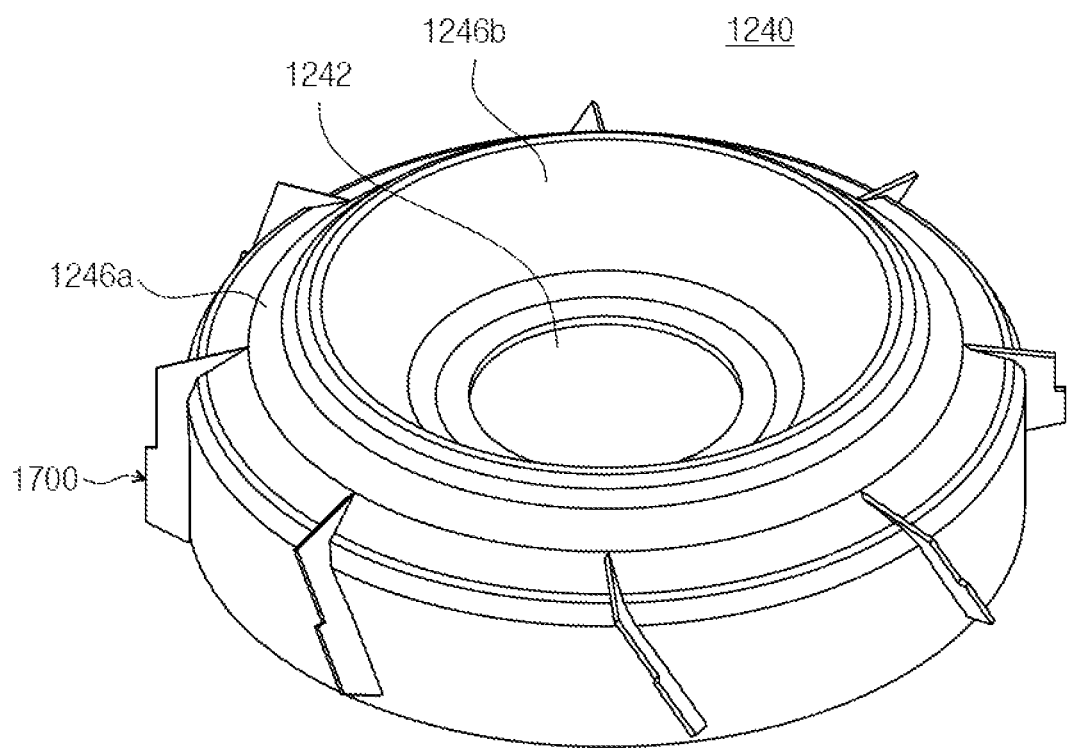
FIG. 12 is a perspective view illustrating a state in which a guide member of FIG. is coupled to an inner cup.
Figure 13:
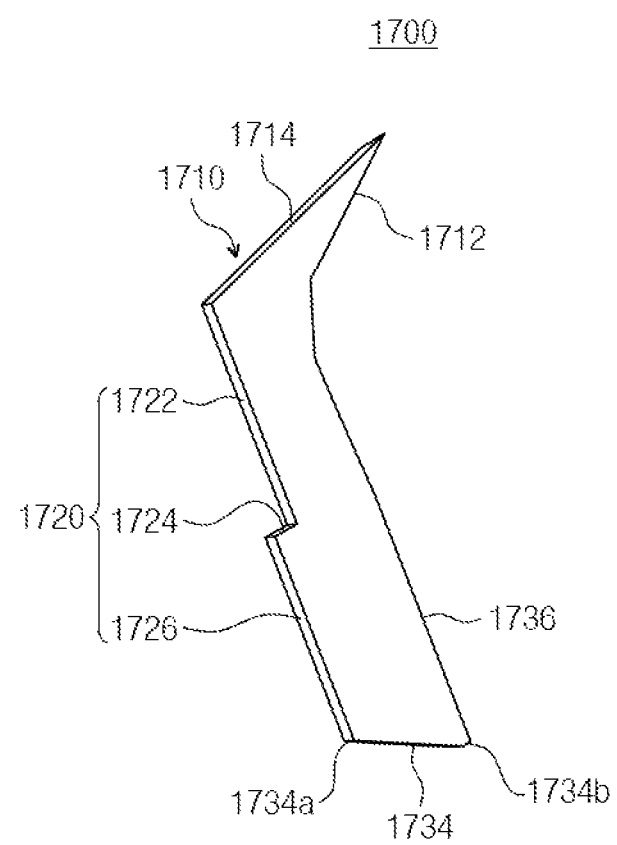
FIG. 13 is a perspective view of the guide member of FIG. 10.

Referring to FIG. 11 to FIG. 12, a plurality of guide members 1700 can be provided to be spaced apart from each other on the outer surface of the inner cup 1240 along a circumferential direction of the substrate W supported by the support unit. In an embodiment, the guide members 1700 may be disposed at a same interval so that the airflow formed in the inner space 1252 is uniform. For example, eight guide members 1700 may be provided. Selectively, more or less guide members 1700 may be provided.

The guide member 1700 is inclined with respect to a tangential direction of the substrate supported by the support unit 1400 such that the airflow within the inner space obliquely flows with respect to the tangential direction of the substrate W.

In a stacking direction of the substrate W on the support unit 1400, a bottom surface of the guide member 1700 is inclined such that the airflow passes below the bottom surface of the guide member 1700 and a direction of the airflow is different at a first edge of the bottom surface of the guide member 1700 than at a second edge of the bottom surface of the guide member 1700. The guide plate 1700 is disposed on a surface of the inner cup 1240 that faces away from the exhaust duct 1225.

Referring to FIG. 13, the guide member 1700 has a coupling portion 1710 and an extension portion 1720. The coupling portion 1710 is coupled to the inner cup 1240. An inner surface 1712 of the coupling portion 1710 is coupled to the top wall. Selectively, the coupling portion 1710 may be provided to be coupled to the outer cup 1240. In an embodiment, the coupling portion 1710 has a hook shape to prevent the guide member 1700 from being separated from the inner cup 1240 by an airflow formed in the inner space 1252.

The extension portion 1720 extends from the coupling portion 1710. For example, the extension portion 1720 may extend downwardly but obliquely toward the substrate rotation direction. In an embodiment, the extension portion 1720 may be provided to have the same length as the outer wall 1244. The extension portion 1710 with its lengthwise direction length having a predetermined angle α with respect to the tangential direction of the substrate W. The angle may be 30 to 60 degrees. In an embodiment, an angle may be provided at 45 degrees. Since the extension portion 1720 extends obliquely with respect to the tangential direction of the substrate W, the airflow in the inner space 1252 has an oblique direction by the extension portions 1720 with respect to the rotation direction of the substrate W.

In the inventive concept, the tangential direction of the substrate refers to a direction perpendicular to a radial direction of the substrate, and includes all directions parallel thereto as well as a direction perpendicular to the radial direction at an end of the substrate.

In an embodiment, a bottom end 1734 of the extension portion 1720 is downwardly inclined in a direction toward the inner cup 1240. In an embodiment, the coupling portion 1710 may be coupled to the top wall 1246 of the inner cup 1240, and the extension portion 1720 may be provided to contact the outer wall 1244 of the inner cup 1240. An airflow formed in the inner space 1252 has a direction downwardly inclined in a direction toward the inner cup 1240 along the bottom end 1734 of the extension portion 1720.

In an embodiment, the extension portion 1720 has outer surfaces 1722 and 1726 extending from a first surface 1714 which is an outer surface of the coupling part 1710, and an inner surface 1736 extending from a second surface 1712 which is an inner surface of the coupling portion 1710. That is, the outer surfaces 1722 and 1726 are surfaces facing the outer cup 1220, and the inner surface 1736 is a surface facing the inner cup 1240. In an embodiment, the inner surface 1736 may be provided to be in contact with the inner cup 1240. For example, the inner surface 1736 may be attached to the inner cup 1240. Alternatively, the inner surface 1736 may be provided to be spaced apart from the inner cup 1240.

In an embodiment, the outer surfaces 1722 and 1726 of the extension portion 1720 adjacent to the outer cup 1220 are provided with a groove portion 1724 for forming an airflow inclined with respect to the rotation direction of the substrate W. In an embodiment, an outer surface of the extension portion 1720 has a top surface and a bottom surface, and the groove portion 1724 is provided between the top surface and the bottom surface. In an embodiment, the extension portion 1720 may be provided in a stepped shape by the groove portion 1724. The airflow adjacent to the guide member 1700 passes through the groove portion 1724 according to the rotation of the substrate W. The groove portion 1724 increases a flow rate of such an airflow and prevents the airflow from being blocked by the extension portion 1720.

In an embodiment, the groove portion 1724 is provided at a position higher than a top end of the exhaust duct 1225 provided in the exhaust space 1248. Accordingly, the airflow passing through the groove portion 1724 may be sucked into the exhaust duct 1225 by a downward airflow formed by the fan filter unit.

Figure 14:
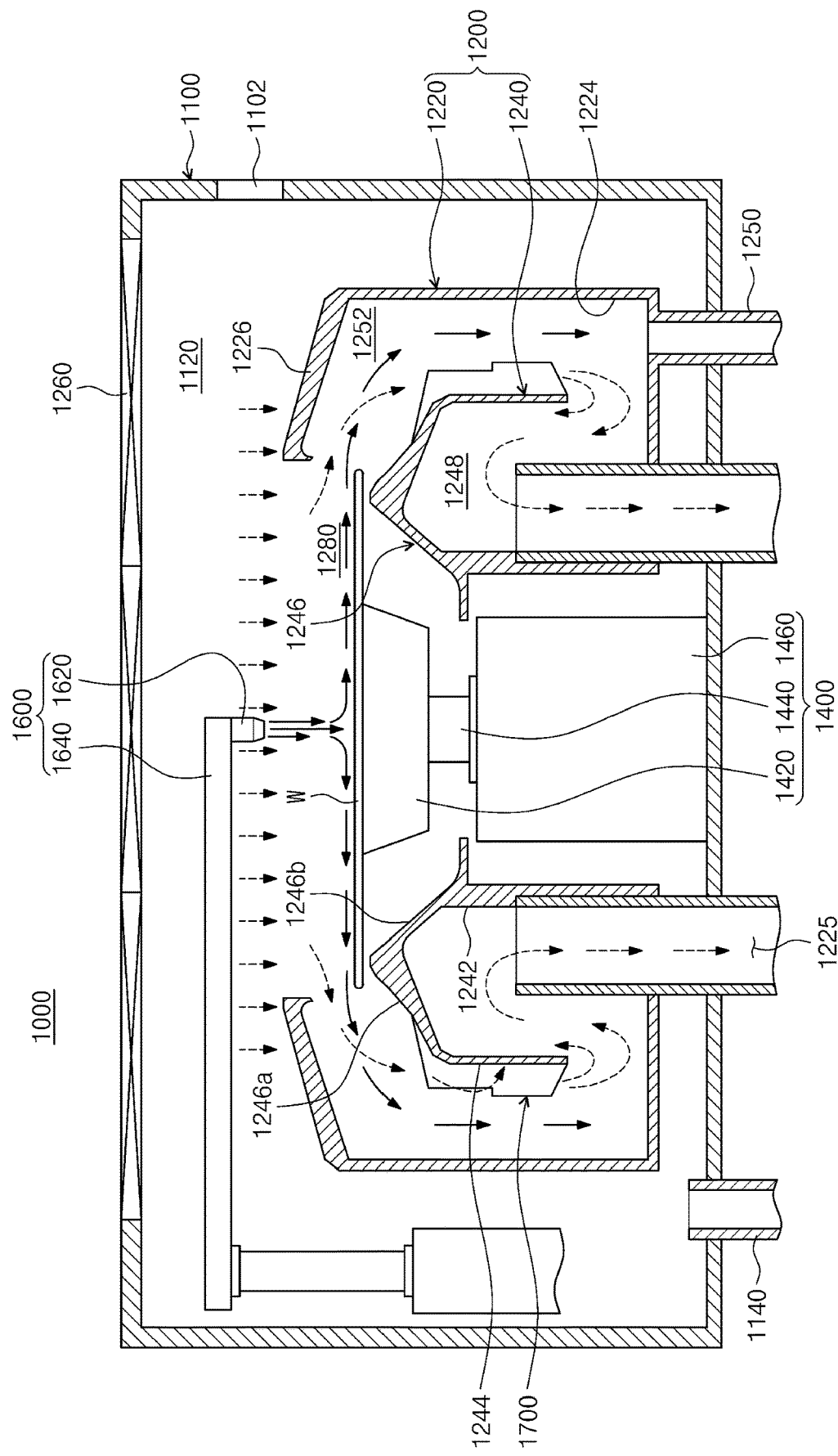
FIG. 14 is a cross-sectional view and a partially cut perspective view showing an air flow and a flow path of the treating liquid in an inner space of a treating container when the substrate is liquid-treated using the apparatus of FIG. 10.

Hereinafter, an airflow formed at the inner space 1252 when the substrate W is liquid-treated using the apparatus of FIG. 10 will be described with reference to FIG. 14. FIG. 14 is a cross-sectional view illustrating an airflow and a flow path of the treating liquid in the inner space 1252 of the treating container 1200 when the substrate W is liquid-treated using the apparatus of FIG. 10.

Referring to FIG. 14, during a performing of a coating process the substrate W is supported by the support plate 1420 and rotated by the support plate 1420. The external air forms a downward airflow toward the substrate W by the fan filter unit 1260. In addition, the treating liquid 82 such as a photoresist liquid is supplied from the nozzle 1620 to the substrate W. By the rotation of the substrate W, the airflow 84 flows while being bent in the rotation direction of the substrate W in the direction facing the outside of the substrate W at the top surface of the substrate and an adjacent region. When the airflow 84 flows outside the substrate W, the airflow 84 faces a downward direction by the downward airflow formed by the fan filter unit 1260.

In this case, since the guide member 1700 is provided to form the airflow 84 in an oblique direction with respect to the rotation direction of the substrate W, the airflow 84 flowing to the outside of the substrate W is formed in a downwardly inclined direction. The airflow 84 formed by the guide member 1700 gradually flows downward in the inner space 1252. Thereafter, the airflow 84 is sucked into the exhaust duct 1225 by a negative pressure formed in the exhaust space 1248.

Figure 15:
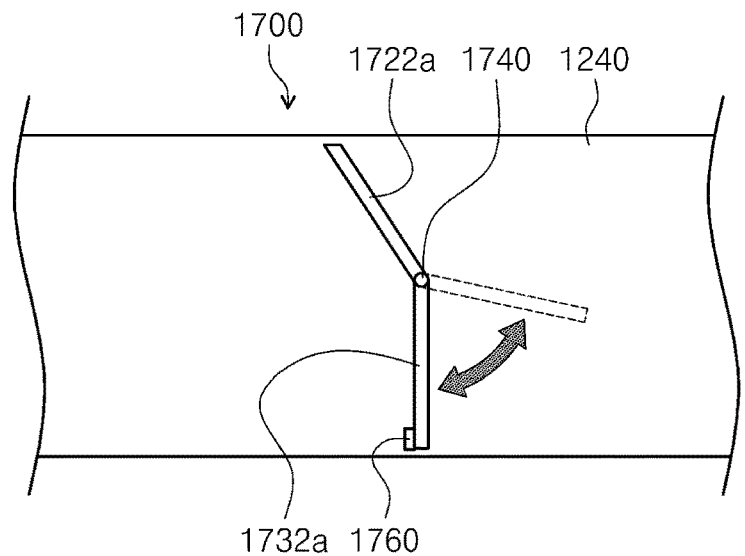
FIG. 15 and FIG. 16 are a diagram schematically illustrating another exemplary embodiment of guide member of FIG. 10.

In the above-described example, the guide member 1700 has been described as coupling and fixing the coupling part 1710 and the inner surface 1736 to the inner cup 1240. However, unlike this, the guide member 1700 may be provided to be rotatable. For example, referring to FIG. 15, the guide member 1700 further includes a hinge pin 1740 for coupling the extension portion 1720 to the treating container 1200 in a central region in a lengthwise direction of the extension portion 1720. In an embodiment, the extension portion 1720 has a fixing part 1722a disposed above the hinge pin 1740 and a rotation part 1732a disposed below the hinge pin 1740. In an embodiment, the fixing part 1722a is fixed to the treating container 1200, and the rotation part 1732a is provided to be rotatable on the hinge pin 1740. A stopper 1760 is provided at the inner cup 1240, and the stopper 1760 limits a rotation angle of the rotation part 1732a. In an embodiment, the rotation angle of the rotation part 1732a is limited so that the rotation part 1732a rotates within a direction perpendicular to the tangential direction of the substrate W and the direction perpendicular to the substrate W.

Figure 16:
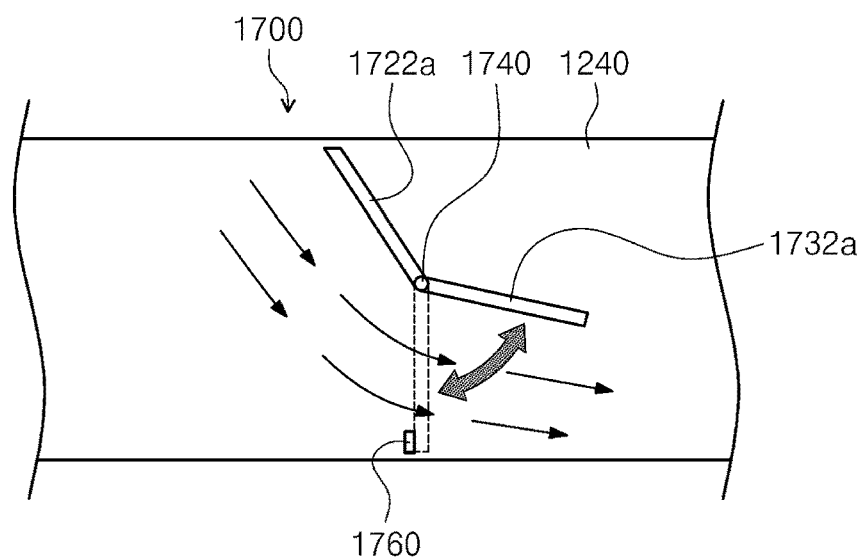

As the rotation speed of the substrate W increases, the airflow formed in the inner space 1252 becomes stronger. Accordingly, as the rotation speed of the substrate W increases, a rotation angle of the rotation part 1732a increases. For example, when the airflow formed in the inner space 1252 becomes sufficiently large, the rotation part 1732a is rotated to be in a direction parallel to the rotating direction of the substrate W, as illustrated in FIG. 16.

In the above-described example, the inner surface of the extension portion 1720 has been described as contacting the inner cup 1240. However, unlike this, the inner surface of the extension portion 1720 may be provided to be spaced apart from the inner cup 1240 at a predetermined angle β. Accordingly, an airflow may flow at a high speed between the extension portion 1720 and the inner cup 1240. In an embodiment, the inner surface of the extension portion 1720 may be provided such that a distance from the inner cup 1240 increases toward a bottom direction.

In the above-described example, it has been described that the guide member 1700 is coupled to the inner cup 1240. However, unlike this, the guide member 1700 may be provided as a structure independent of the outer cup 1220 or the inner cup 1240. For example, the guide member 1700 is located within the inner space 1252, but can be supported by a support member provided outside the outer cup 1220 or the inner cup 1240.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a treating container comprising an inner cup and an outer cup, the treating container
   having an inner space encircled by an outer cup;
   a support configured to support and rotate a substrate within the inner space;
   an exhaust duct configured to exhaust the inner space, the inner cup having an outer wall
   and an inner wall, an outer wall of the inner cup is located between the exhaust duct and the outer cup such that a first surface of the outer wall of the inner cup faces the exhaust duct and a second surface of the outer wall faces away from the exhaust duct, the exhaust duct located within the inner space and between the inner wall and the outer wall of the inner cup; and
   at least one guide plate combined with the treating container and configured to guide an airflow within the inner space,
   wherein the at least one guide plate is inclined with respect to a tangential direction of the substrate supported by the support such that the airflow within the inner space obliquely flows with respect to the tangential direction of the substrate,
   wherein, in a stacking direction of the substrate on the support, a bottom surface of the guide plate is inclined such that the airflow passes below the bottom surface of the guide plate, a direction of the airflow being different at a first edge of the bottom surface of the guide plate than at a second edge of the bottom surface of the guide plate, and
   wherein the guide plate is disposed on the second surface of the inner cup that faces away from the exhaust duct.

2. The substrate treating apparatus of claim 1, wherein each of the at least one guide plate comprises:
a coupling part configured to combine with the treating container; and
an extension part extending from the coupling part, provided in a direction from a top to a bottom so a lengthwise direction of the extension part has a predetermined angle with respect to the tangential direction of the substrate.

3. The substrate treating apparatus of claim 2, wherein one end of the coupling part is combined to the treating container.

4. The substrate treating apparatus of claim 2, wherein the predetermined angle is 45 degrees.

5. The substrate treating apparatus of claim 2, wherein each of the at least guide plate further comprises a hinge pin configured to combine the extension part to the treating container at a middle point of the extension part, and
wherein the extension part further comprises:
a fixing part disposed above the hinge pin and configured to be fixed to the treating container; and
a rotation plate disposed below the hinge pin and configured to rotate based on the hinge pin.

6. The substrate treating apparatus of claim 5, wherein the each of the at least guide plate further comprises a stopper configured to limit a rotation angle of the rotation plate so the rotation plate rotate within between the tangential direction of the substrate and a direction perpendicular to the substrate.

7. The substrate treating apparatus of claim 1, further comprising:
a fan unit configured to supply a downward airflow into the inner space; and
a nozzle configured to supply a treating liquid to the substrate supported by the support.

8. The substrate treating apparatus of claim 1, wherein the at least one guide plate comprises a plurality of guide plates spaced apart along a circumferential direction of the substrate supported by the support.

9. A substrate treating apparatus comprising:
a treating container having an inner space;
a support configured to support and rotate a substrate within the inner space;
an exhaust duct configured to exhaust an airflow within the inner space; and a plurality of guide plates disposed in the treating container and configured to guide the airflow within the inner space, wherein the plurality of guide plates are disposed adjacent so as to be inclined with respect to a tangential direction of the substrate supported by the support,
wherein a first guide plate of the plurality of guide plates is provided; wherein a lengthwise direction of the first guide plate extending in a direction from a top to a bottom, wherein the treating container comprises:
an outer cup having an inner space with an open top; and an inner cup disposed within the inner space, having a cup shape with an opening formed at a top of the inner cup, and having a treating space formed within,
wherein the inner cup has an outer wall and an inner wall, an outer wall of the inner cup is located between the exhaust duct and the outer cup such that a first surface of the outer wall of the inner cup faces the exhaust duct and a second surface of the outer wall faces away from the exhaust duct, the exhaust duct located within the inner space and between the inner wall and the outer wall of the inner cup, and
wherein, in a stacking direction of the substrate on the support, a bottom surface of the first guide plate is inclined such that the airflow passes below the bottom surface of the first guide plate, a direction of the airflow being different at a first edge of the bottom surface of the first guide plate than at a second edge of the bottom surface of the first guide plate, and wherein the first guide plate is disposed on the second surface of the inner cup that faces away from the exhaust duct.

10. The substrate treating apparatus of claim 9, wherein the guide plate is provided between the outer cup and the inner cup.

11. The substrate treating apparatus of claim 9, wherein the first guide plate comprises:
a coupling part configured to combine with the inner cup; and
an extension part extending from the coupling part, provided in a direction from the top to the bottom so a lengthwise direction of the extension part has a predetermined angle with respect to the tangential direction of the substrate.

12. The substrate treating apparatus of claim 11, wherein a bottom end of the extension part is provided to be downwardly inclined in a direction facing the inner cup.

13. The substrate treating apparatus of claim 11, wherein at an outer surface of the extension part adjacent to the outer cup, a groove portion is configured to form an inclined airflow based on the tangential direction of the substrate.

14. The substrate treating apparatus of claim 13, wherein the inner cup defines an exhaust space coupled to an exhaust pipe within the inner space, and
an airflow within the inner space is exhausted from the treating container after being introduced into the exhaust space.

15. The substrate treating apparatus of claim 14, wherein the extension part is disposed at a position higher than a top end of the exhaust duct provided at the exhaust space.

16. The substrate treating apparatus of claim 11, wherein the first guide plate further comprises a hinge pin configured to couple the extension part to the treating container at a central region of a lengthwise direction of the extension part, and
wherein the extension part further comprises:
a fixing part disposed above the hinge pin and configured to be fixed to the treating container; and
a rotation plate disposed below the hinge pin and configured to rotate based on the hinge pin.

17. The substrate treating apparatus of claim 16, wherein the inner cup further comprises a stopper configured to limit a rotation angle of the rotation plate so the rotation plate rotate within between the tangential direction of the substrate and a direction perpendicular to the substrate.

18. The substrate treating apparatus of claim 9, further comprises:
a fan unit configured to supply a downward airflow into the inner space; and a nozzle configured to supply a treating liquid to the substrate supported by the support.

19. The substrate treating apparatus of claim 9, wherein the first guide plate provided in a plurality is spaced apart along a circumferential direction of the substrate supported by the support.

20. The substrate treating apparatus of claim 18, wherein the nozzle is configured to supply a viscous photoresist liquid as the treating liquid.

\* \* \* \* \*